(12) United States Patent
Min

(10) Patent No.: US 7,041,582 B2
(45) Date of Patent: May 9, 2006

(54) METHOD OF MANUFACTURING SEMICONDUCTOR DEVICE

(75) Inventor: Woo Sig Min, Icheon-Shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 10/878,478

(22) Filed: Jun. 29, 2004

(65) Prior Publication Data

US 2005/0106857 A1    May 19, 2005

(30) Foreign Application Priority Data

Nov. 13, 2003   (KR) ...................... 10-2003-0080042

(51) Int. Cl.
    *H01L 41/425*    (2006.01)
(52) U.S. Cl. ...................................... 438/530; 438/550
(58) Field of Classification Search ................ 438/530, 438/533, 550, 935
    See application file for complete search history.

(56) References Cited

U.S. PATENT DOCUMENTS

| 6,461,982 B1* | 10/2002 | DeBoer et al. ............. 438/778 |
| 2004/0151845 A1* | 8/2004 | Nguyen et al. ............. 427/569 |
| 2005/0170601 A1* | 8/2005 | Yoon et al. ................. 438/396 |

FOREIGN PATENT DOCUMENTS

| KR | 1999-12246 | 2/1999 |
| KR | 1020030044395 | 6/2003 |
| KR | 1020030051040 | 6/2003 |

* cited by examiner

*Primary Examiner*—Phuc T. Dang
(74) *Attorney, Agent, or Firm*—Mayer, Brown, Rowe & Maw LLP

(57) ABSTRACT

The present invention relates to a method of manufacturing a semiconductor device. A barrier metal layer for blocking a metal material from being diffused into an insulating film is formed by means of an ALD method. At this time, the barrier metal layer is formed to have an amorphous structure and the barrier metal layer at the bottom of a contact hole or a via hole is selectively removed so that the barrier metal layer having good anti-diffusion properties even in a thin thickness is obtained. Therefore, it is possible to prevent resistance from increasing due to the barrier metal layer.

19 Claims, 4 Drawing Sheets

METHOD OF MANUFACTURING SEMICONDUCTOR DEVICE

BACKGROUND

1. Field of the Invention

The present invention relates to a method of manufacturing a semiconductor device, and more specifically, to a method of manufacturing a semiconductor device which can improve the anti-diffusion properties of a barrier metal layer formed between a metal wire and an insulating film and prevent an increase in resistance by the barrier metal layer.

2. Discussion of Related Art

Generally, a metal wire is formed in such a way that a dual damascene patterns having a trench and a contact hole (or a via hole) is formed in an interlayer insulating film through a dual damascene process and is then filled with a metal material. At this time, a barrier metal layer for preventing a metal component of the metal wire from diffusing into the interlayer insulating film is formed between the metal wire and the interlayer insulating film.

The degree that the metal component is diffused into the interlayer insulating film varies depending on the material of the metal wire. In case of aluminum (Al), it has been known that diffusion of Al into $SiO_2$ used as an insulating film never occurs. Therefore, in case of an Al metal wire, it is possible to form a barrier metal layer thinly. As such, the barrier metal layer does not greatly influence the electrical properties.

On the contrary, copper (Cu) is easily diffused into $SiO_2$ used as the insulating film. Cu diffused into a device through the insulating film exists within Si as a deep level. That is, Cu acts as a deep level dopant within Si, thus forming several acceptor and donor levels within the forbidden band of Si. These deep levels function as a source of generation-recombination to cause the leakage current. In worse case, it causes the device to be defective.

Accordingly, if a metal wire is formed using a metal material such as Cu that is easily diffused, there is a need for a barrier metal for an insulating material at the sidewalls as well as the bottom brought into contact with a heterogeneous metal.

A metal wire process using Cu is a prerequisite process as the integration level of a device is increased by the electrical properties. In this case, as the aspect ratio of the trench or the contact hole is increased due to the increased level of integration, the deposition characteristic of the barrier metal layer is degraded. Therefore, there is a problem that a step coverage characteristic is poor.

Recently, HCM TaNx, SIP TaNx and so on and an advanced PVD have been employed. It is thus considered that there is no significant problem in forming the barrier metal layer up to a 90 nm process. In the future, however, in a 90 nm or less process, it would be impossible to apply the barrier metal layer of the PVD method due to fine pores contained in low-dielectric insulating materials as well as reduction in the pattern size.

A sole solution for overcoming this problem is to form the barrier metal layer through an atomic layer deposition (hereinafter, referred to as "ALD") method. The ALD method is one in which gases to be reacted are introduced into a chamber in turn one by one to deposit atomic layers one by one, unlike the CVD method. The ALD method is superior in the step coverage characteristic. If the design rule is 90 nm or less, however, the barrier metal layer formed by the ALD method has a very thin thickness of several tens Å or less. It is thus difficult to expect good metal (particularly, Cu) anti-diffusion properties.

SUMMARY OF THE INVENTION

Accordingly, the present invention has been made in view of the above problems, and it is an object of the present invention to provide a method of manufacturing a semiconductor device which can prevent an increase in resistance by a barrier metal layer, in such a manner that a barrier metal layer for preventing metal material from diffusing into an insulating film is formed by means of an ALD method, wherein the barrier metal layer has an amorphous structure and the barrier metal layer at the bottom of a contact hole or a via hole is selectively removed, so that good anti-diffusion properties can be obtained even in a thin thickness.

In order to accomplish the object, according to an aspect of the present invention, there is provided a 1. A method of manufacturing a semiconductor device, comprising: a) providing a semiconductor substrate on which various components for forming a semiconductor device are formed; b) supplying a precursor containing a source into a deposition chamber to adsorb the source on the semiconductor substrate; c) removing the precursor which is not absorbed on the semiconductor substrate and remains in the deposition chamber to purify the interior of the deposition chamber, wherein other impurities are removed with the precursor; d) supplying a reaction gas into the deposition chamber to form an atomic layer through reaction with the source adsorbed on the semiconductor substrate; e) removing the reaction gas which is not reacted with the source to purify the interior of the deposition chamber, wherein reaction byproducts are removed with the reaction gas; f) supplying an additive gas into the deposition chamber in order to make the atomic layer an amorphous state; and g) removing additive gas to purify the interior of the deposition chamber.

DETAILED DESCRIPTION OF PREFERRED EMBODIMENTS

Figure 1A:
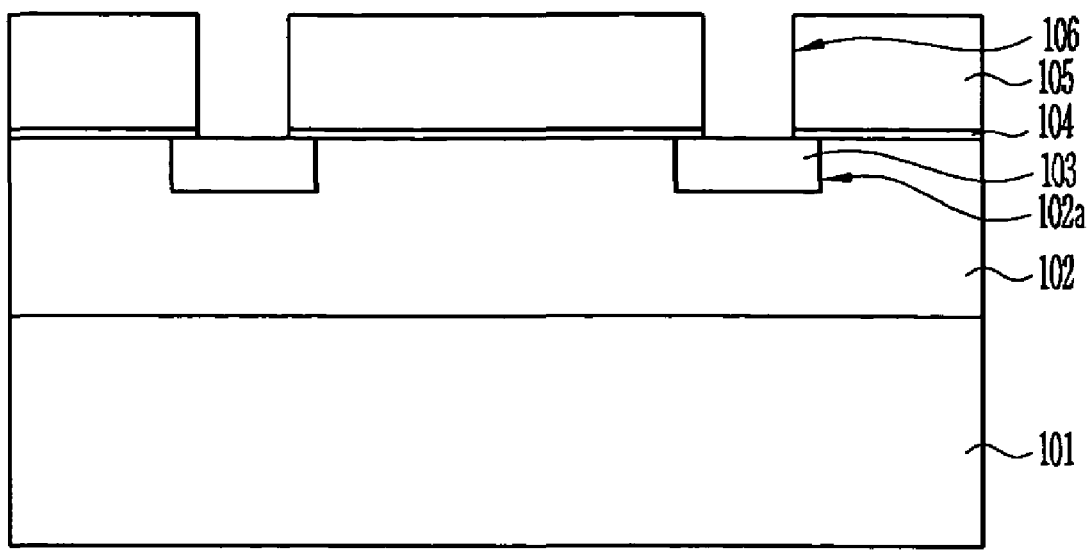
FIG. 1A to FIG. 1F are cross-sectional views for explaining a method of manufacturing a semiconductor device according to an embodiment of the present invention.

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Meanwhile, in case where it is described that one film is "on" the other film or a semiconductor substrate, the one film may directly contact the other film or the semiconductor substrate. Or, a third film may be intervened between the one film and the other film or the semiconductor substrate. Further, in the drawing, the thickness and size of each layer are exaggerated for convenience of explanation and clarity. Like reference numerals are used to identify the same or similar parts.

FIG. 1A to FIG. 1F are cross-sectional views for explaining a method of manufacturing a semiconductor device according to an embodiment of the present invention.

Referring to FIG. 1A, a semiconductor substrate 101 in which various components for forming a semiconductor device is provided. For example, a transistor or a memory cell (not shown) can be formed in the semiconductor substrate 101. A lower interlayer insulating film 102 is formed on the semiconductor substrate 101. A dual damascene patterns having a contact hole (not shown) and trenches 102a is then formed in the lower interlayer insulating film 102 by means of a dual damascene process. The dual damascene patterns are filled with a conductive material to form lower metal wires 103. At this time, the lower metal wires 103 can be formed using copper (Cu). Meanwhile, in order to prevent a metal component of the lower metal wires 103 from diffusing into the lower interlayer insulating film 102, a barrier metal layer (not shown) can be formed in the lower metal wires 103 and the lower interlayer insulating film 102.

Thereafter, a dielectric barrier layer 104 and an upper interlayer insulating film 105 are sequentially formed on the entire surface. Damascene patterns 106 such as contact holes or trenches are formed in the upper interlayer insulating film 105 by means of a dual damascene process. Some regions of the lower metal wires 103 are exposed through the damascene patterns 106.

Figure 1B:
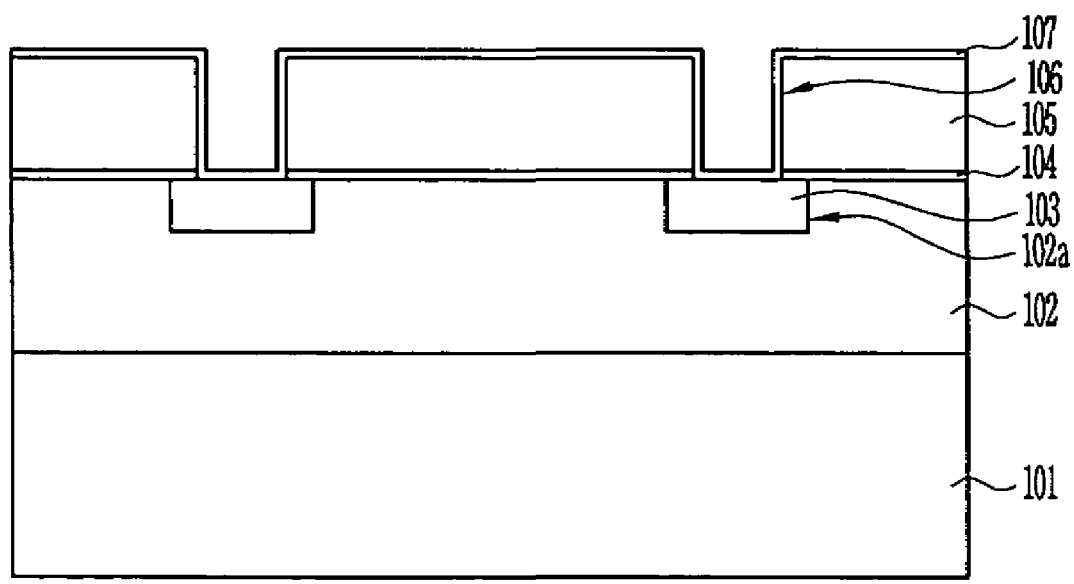

By reference to FIG. 1B, a barrier metal layer 107 is formed on the entire surface including the damascene patterns 106. In this case, in order to improve the step coverage characteristic of the barrier metal layer 107 at the top edges of the damascene patterns 106 having a high aspect ratio due to a narrow width, it is preferred that the barrier metal layer 107 is formed by means of the ALD method.

Figure 2:
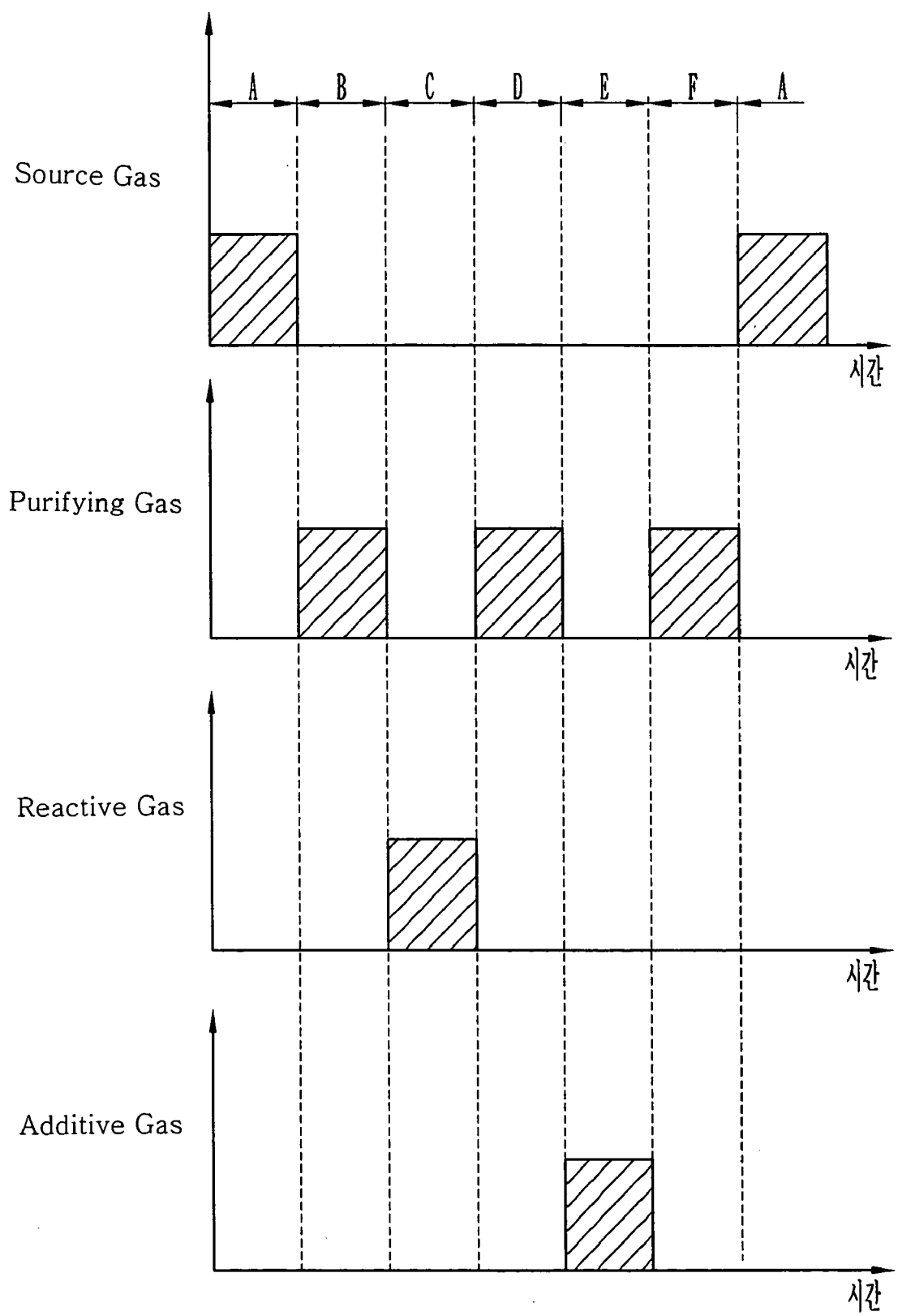
FIG. 2 shows a recipe for explaining a method of forming a barrier metal layer by means of the ALD method.

FIG. 2 shows a recipe for explaining a method of forming the barrier metal layer by means of the ALD method.

Referring to FIG. 2, the method of forming the barrier metal layer includes a first step A wherein a precursor containing a source is supplied into a deposition chamber and is adsorbed on the semiconductor substrate by means of the ALD method, a second step B wherein the source gas and other impurities that are not adsorbed on the semiconductor substrate are removed to purify the interior of the chamber, a third step C wherein a reaction gas is supplied into the deposition chamber to form a barrier metal layer having an atomic layer through reaction with the source adsorbed on the semiconductor substrate, and a fourth step D wherein the reaction gas and reaction byproducts that are not reacted with the source are removed to purify the interior of the chamber. The first to fourth steps form 1 cycle. This 1 cycle is repeatedly performed to form the barrier metal layer of a target thickness. At this time, it is preferred that the number repeatedly performed is determined depending on the relationship between a thickness of the barrier metal layer deposited through 1 cycle and a target thickness. 300 times can be repeatedly performed once. Meanwhile, it is preferable that the precursor containing the source, the reaction gas and the purification gas are supplied into the deposition chamber through different supply lines.

In the first step A, a metal organic source or a halide compound material can be used as the precursor containing the source. In the concrete, a metal organic source such as PDMAT (pentakisdimethylamino tantalum) and TBTDET (tertbutylimidotris (diethylamido) tantalum), and a halide compound such as $TaCl_5$, $TaBr_5$ and $TaI_5$ can be used as the precursor containing the source. In the second step B or the fourth step D, an Ar, $N_2$ or He gas can be used as the purification gas for purifying the interior of the chamber. In the third step C, a nitrogen mixed gas or a $N_2$ or $NH_3$ gas can be used as the reaction gas. Further, the reaction method may include a heating method by heating only, and a method for generating plasma within the chamber to introduce reaction.

The above steps can be performed for 0.1 to 5 seconds. It is preferred that the steps are implemented at a temperature of 100° C. to 400° C. Through the above steps, the barrier metal layer can be formed using Ta, TaN, TaC, WN, TiN, TiW, TiSiN, WBN or WC. The barrier metal layer is preferably formed in thickness of 5 Å to 100 Å.

At this time, in order to obtain the barrier metal layer having good anti-diffusion properties even in a thin thickness, it is preferred that the barrier metal layer is formed to have an amorphous structure having nothing defects such as a grain boundary. There are several methods for forming the barrier metal layer having the amorphous structure.

Figure 1C:
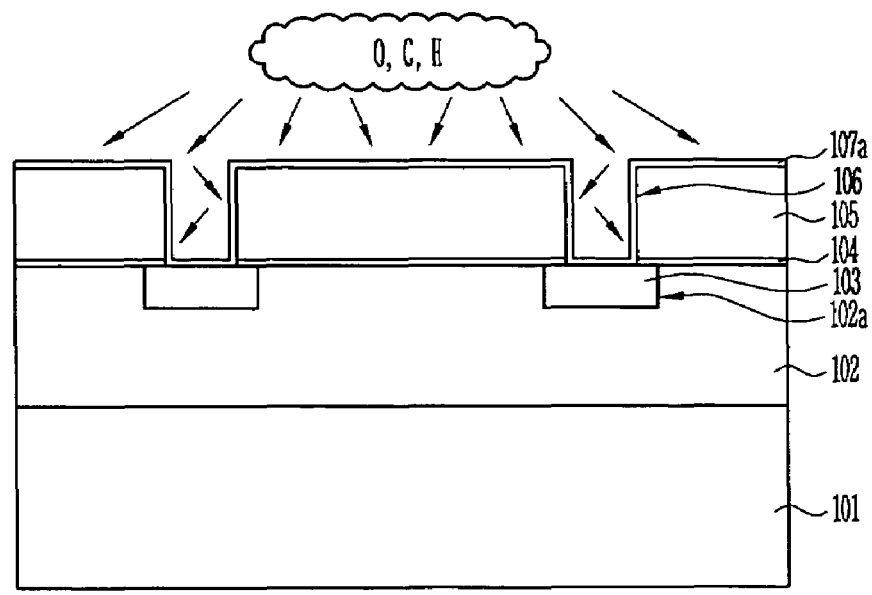

Referring to FIG. 1C and FIG. 2, according to a preferred embodiment of the present invention, a step of forming the barrier metal layer (107 in FIG. 1B) having the amorphous structure, which is formed every 1 cycle, is further performed. In more detail, when the step is performed every 1 cycle, if a fifth step E wherein a gas containing O, C or H components, or a mixed gas thereof is supplied as an additive gas and a sixth step F wherein the additive gas is removed to purify the interior of the chamber are further performed, the barrier metal layer (107 in FIG. 1B) can be changed into a barrier metal layer 107a of the amorphous structure. Also, whenever 1 cycle is performed several to several tens of times, the fifth step and the sixth step can be performed. In this case, it is preferred that the additive gas is supplied to the deposition chamber through a supply line different from the precursor containing the source, the reaction gas and the purification gas. In the above, the additive gas may include an $O_2$, CO, $CO_2$, $H_2$ or $NH_3$ gas and the supply time may be 0.1 to 5 seconds. Furthermore, it is preferred that the partial pressure within the chamber of the additive gas is set to $10^{-3}$ torr to 10 torr. For example, in case where the barrier metal layer is formed using a TiN film, if an additive gas containing oxygen is supplied, Ti—N—O coupling is accomplished to form the barrier metal layer of an amorphous state. It is thus possible to improve the anti-diffusion properties by the oxygen stuffing effect.

Figure 1D:
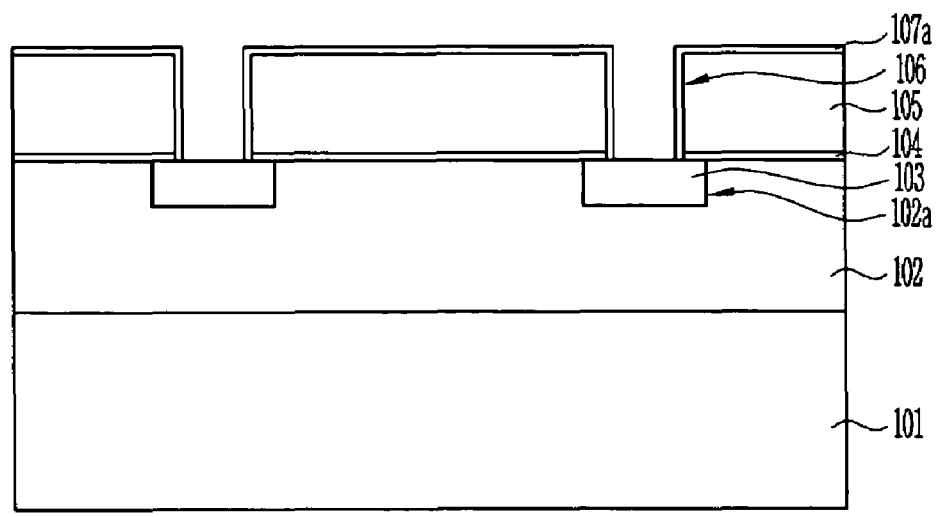

Referring to FIG. 1D, after the barrier metal layer 107a is made into the amorphous state, the barrier metal layer 107a of the amorphous state formed on the lower metal wires 103 can be removed. This is because the anti-diffusion properties of the barrier metal layer 107a are improved but a specific resistance value thereof is increased as the barrier metal layer 107a becomes the amorphous state due to addition of an impurity such as O, C or H in FIG. 1, and electrical resistance with the lower metal wires 103 and an upper metal wires to be formed in a subsequent process is thus increased. Therefore, in order to lower this resistance, it is preferred that the barrier metal layer 107a of the amorphous state formed on the lower metal wires 103 is removed.

The process of removing the barrier metal layer 107a formed on the lower metal wires 103 can be performed in such a manner that the barrier metal layer 107a formed on the lower metal wires 103 is re-sputtered within an Ionized PVD module or a pre-cleaning module. In this case, a DC power of 1 kW to 10 kW can be applied and a RF bias (for example, frequency is 13.56 MHz) of 50W to 500W can be applied.

If the barrier metal layer 107a formed on the lower metal wires 103 is removed by the re-sputtering method as such, some of the barrier metal layer 107a are re-deposited at the sidewalls of the damascene patterns 106 while the barrier metal layer 107a formed on the lower metal wires 103 is re-sputtered. It is thus possible to further improve the anti-diffusion properties into the sidewalls of the upper interlayer insulating film 105.

Thereby, the top surface of the lower metal wires 103 is exposed again through the damascene patterns 106.

The upper metal wires 109 can be formed by forming metal seed layers (not shown), depositing a metal material through an electroless plating method, an electroplating method, a PVD method or a CVD method, and then performing an annealing process. It is preferred that the metal seed layer or the metal material is formed using copper. At this time, the metal seed layer can be formed by means of the PVD method or the CVD method, and can be formed 50 Å to 1500 Å in thickness. Moreover, the metal seed layer can be formed only at the sidewalls of and within the damascene patterns (106 in FIG. 1D), or can be formed on the entire structure.

After the damascene patterns (106 in FIG. 1D) are filled with the metal material as such, the metal material deposited on the upper interlayer insulating film 105 and the metal seed layer are removed. The metal material and the metal seed layer can be removed by means of a chemical mechanical polishing process. During the process of performing the chemical mechanical polishing process as such, the second and first barrier metal layers 108 and 107 formed on the upper interlayer insulating film 105 can be also removed.

Through the above method, a metal wire by which the lower metal wires 103 and the upper metal wires 109 are directly brought into contact is formed.

Figure 1E:
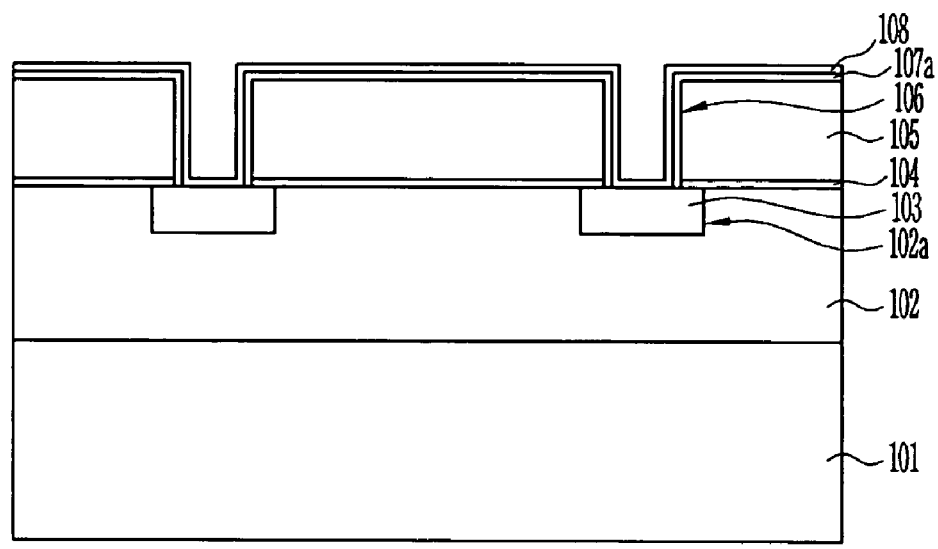

Referring to FIG. 1E, metal seed layers 108 are formed on the semiconductor substrate 101 including the damascene patterns 106. The metal seed layers 108 are preferably formed using copper. In this case, it is preferred that the metal seed layers 108 are formed in-situ without breaking vacuum after the oxide removing process is performed. The metal seed layers 108 can be formed in thickness of 50 Å to 1500 Å. Meanwhile, the metal seed layers 108 can be formed only at the sidewalls of and within the damascene patterns 106 and can be formed on the entire structure.

Figure 1F:
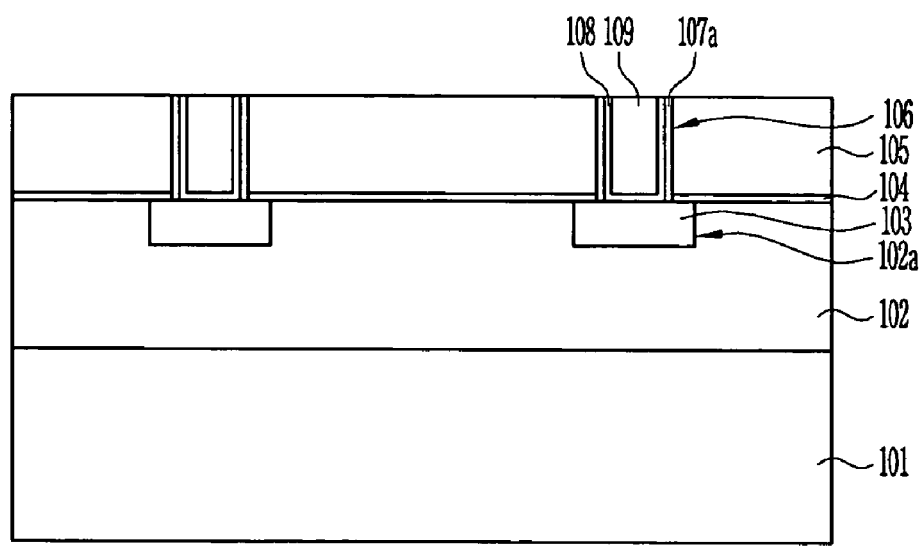

Referring to FIG. 1F, the damascene patterns 106 are filled with a metal material to form an upper metal wires 109. The upper metal wires 109 can be formed in such a way that the metal material is deposited using the metal seed layers 108 by means of an electroless plating method, an electroplating method, a PVD method or a CVD method, and the metal material formed on the upper interlayer insulating film 105 and the metal seed layers are then removed. The metal material on the upper interlayer insulating film 105 and the metal seed layers can be removed by means of the CMP process.

The method of forming the barrier metal layer to have the amorphous structure while forming the barrier metal layer by means of the ALD method is not limited to only the case where the barrier metal layer is formed, but can be applied to all processes for forming a film of an amorphous structure while improving the step coverage characteristic.

According to the present invention, a barrier metal layer for preventing a metal material from diffusing into an insulating film is formed by means of an ALD method. In this case, the barrier metal layer is formed in an amorphous structure, and the barrier metal layer at the bottom of a contact hole or a via hole is selectively removed so that the barrier metal layer having good anti-diffusion properties even in a thin thickness is obtained. Therefore, it is possible to prevent an increase in resistance by a barrier metal layer.

What is claimed is:

1. A method of manufacturing a semiconductor device, comprising:
    a) providing a semiconductor substrate on which various components for forming a semiconductor device are formed;
    b) supplying a precursor containing a source into a deposition chamber to adsorb the source on the semiconductor substrate;
    c) removing the precursor which is not absorbed on the semiconductor substrate and remains in the deposition chamber to purify the interior of the deposition chamber, wherein other impurities are removed with the precursor;
    d) supplying a reaction gas into the deposition chamber to form an atomic layer through reaction with the source adsorbed on the semiconductor substrate;
    e) removing the reaction gas which is not reacted with the source to purify the interior of the deposition chamber, wherein reaction byproducts are removed with the reaction gas;
    f) supplying an additive gas into the deposition chamber in order to make the atomic layer an amorphous state; and
    g) removing the additive gas to purify the interior of the deposition chamber.

2. The method as claimed in claim 1, wherein one cycle consisting of the step a) through step e) is repeated at least one time.

3. The method as claimed in claim 1, the step a) including: forming an interlayer insulating film on a semiconductor substrate; and forming a via hole or a trench in the interlayer insulating film.

4. The method as claimed in claim 3, wherein a barrier metal layer of an amorphous state is formed on an entire surface of the interlayer insulating film by repeating one cycle consisting of the step a) through step e) at least one time.

5. The method as claimed in claim 4, wherein the precursor containing the source is a material of a metal organic source or a halide compound.

6. The method as claimed in claim 5, wherein the precursor containing the source is a metal organic source such as PDMAT or TBTDET.

7. The method as claimed in claim 5, wherein the precursor containing the source is a halide compound such as $TaCl_5$, $TaBr_5$ or $TaI_5$.

8. The method as claimed in claim 4, wherein the additive gas is removed with Ar, $N_2$ or He gas.

9. The method as claimed in claim 4, wherein the reaction gas includes a nitrogen mixed gas.

10. The method as claimed in claim 9, wherein the nitrogen mixed gas includes an $N_2$ or $NH_3$ gas.

11. The method as claimed in claim 4, wherein the reaction gas and the source are reacted by means of a heating method or a method for generating plasma within a chamber to introduce reaction.

12. The method as claimed in claim 4, wherein the reaction gas and the source are reacted at a temperature of 100° C. to 400° C.

13. The method as claimed in claim 4, wherein the second to seventh steps are each performed for 0.1 to 5 seconds.

14. The method as claimed in claim 4, wherein the barrier metal layer of the atomic layer is formed using Ta, TaN, TaC, WN, TiN, TiW, TiSiN, WBN or WC.

15. The method as claimed in claim 4, wherein the sixth and seventh step are further performed whenever the 1 cycle is performed, or performed whenever the 1 cycle is performed several to several tens of times.

16. The method as claimed in claim 4, wherein the additive gas includes a gas containing O, C or H components, or a mixed gas thereof.

17. The method as claimed in claim 4, wherein the additive gas includes an $O_2$, CO, $CO_2$, $H_2$ or $NH_3$ gas.

18. The method as claimed in claim 4, wherein the partial pressure within a chamber of the additive gas is set to $10^{-3}$ torr to 10 torr.

19. The method as claimed in claim 4, wherein the precursor including the source, the reaction gas, the additive gas and the purification gas are supplied into the deposition chamber through different supply lines.

* * * * *